United States Patent [19]

Boll et al.

[11] Patent Number: 4,871,964
[45] Date of Patent: Oct. 3, 1989

[54] INTEGRATED CIRCUIT PROBING APPARATUS

[75] Inventors: Gregory G. Boll, Watchung; Harry J. Boll, Berkeley Heights, both of N.J.

[73] Assignee: G. G. B. Industries, Inc., Naples, Fla.

[21] Appl. No.: 180,457

[22] Filed: Apr. 12, 1988

[51] Int. Cl.[4] .................. G01R 31/02; G01R 1/06
[52] U.S. Cl. .................. 324/158 F; 324/158 P; 324/73 PC; 324/72.5
[58] Field of Search .......... 324/158 P, 158 F, 73 PC, 324/72.5; 439/482, 578, 607; 437/8; 361/220

[56] References Cited

U.S. PATENT DOCUMENTS

| | | | |
|---|---|---|---|
| 3,445,770 | 5/1969 | Harmon | 324/158 P X |
| 3,812,311 | 5/1974 | Kvaternik | 439/482 X |
| 3,826,984 | 7/1974 | Epple | 324/158 P |
| 3,832,632 | 8/1974 | Ardezzone | 324/158 F X |
| 3,849,728 | 11/1974 | Evans | 324/158 P |
| 4,116,523 | 9/1979 | Coberly et al. | 439/482 X |
| 4,161,692 | 7/1979 | Tarzwell | 324/158 P |
| 4,382,228 | 5/1983 | Evans | 324/158 P |
| 4,439,809 | 3/1984 | Weight et al. | 361/413 |
| 4,473,798 | 9/1984 | Cedrone | 324/158 P |
| 4,480,223 | 10/1984 | Aigo et al. | 324/158 P |
| 4,593,243 | 6/1986 | Lao et al. | 324/158 P |
| 4,599,599 | 7/1986 | Evans | 324/158 P |
| 4,636,722 | 1/1987 | Ardezzone | 324/158 P |
| 4,697,143 | 9/1987 | Lockwood et al. | 324/158 F |
| 4,727,319 | 2/1988 | Shahriary | 324/72.5 X |
| 4,749,942 | 6/1988 | Sang et al. | 324/158 F |

FOREIGN PATENT DOCUMENTS 0048511 11/1985 Japan ........................ 437/8

Primary Examiner—Reinhard J. Eisenzopf
Assistant Examiner—Vinh P. Nguyen
Attorney, Agent, or Firm—Irwin Ostroff

[57] ABSTRACT

A device for measuring the performance of high speed integrated circuits (ICs) while in wafer form consists of one or more miniature coaxial transmission lines for carrying the test signals to and from test instruments. Each of the miniature coaxial cables has a standard connector at one end for connection to testing instruments. The other end of each cable has its center conductor extended beyond the shield of the cable and formed into a conical point for connection to test pads on the IC. One or more miniature leaf springs are attached to the shield. The leaf springs are adapted so that during a probing operation they contact the test pads first and thereafter flex to allow the center conductors to make contact to other test pads. The miniature coaxial transmission lines also flex to limit forces which could otherwise damage center conductors or the test pads.

27 Claims, 5 Drawing Sheets

INTEGRATED CIRCUIT PROBING APPARATUS

FIELD OF THE INVENTION

This invention relates generally to the testing of integrated circuits and in particular to a probe device for testing of high-speed integrated circuits such as amplifiers and other circuits operating at microwave frequencies.

BACKGROUND OF THE INVENTION

Testing of completed integrated circuits (chips) is an important step in their manufacture. Advantageously, initial testing is performed while the semiconductor chips are still part of the semiconductor wafer. Only those chips that operate satisfactorily are then incorporated into packages, thus saving the expense of packaging defective circuits.

As the integrated circuit art has progressed, the circuits have become higher and higher speed. It is difficult using existing probing apparatus to reliably test high-speed circuits because the inductance of the probing wires and because of inter-probe capacitance.

A number of attempts have been made to provide high-speed test probes for integrated circuits. One relatively high performance probe is described in an article entitled "Microwave Wafer Probing", published in the January, 1985, issue of *Microwave Journal*, p. 121. By means of a co-planar stripline, the manufacturer (Cascade Microwave) was able to maintain 50 ohms resistive impedance down very near to the test pads of an integrated circuit. In some applications this probe has acceptable electrical performance, but has serious mechanical limitations. The most severe of these mechanical problems relates to the unreliability of the contacts. Because two or more contact electrodes are formed on a single ceramic member, there is very little independent motion between the contacts. A small piece of metal from a test pad of an integrated circuit (IC) under test, which is part of a semiconductor wafer, may adhere to one of the contact surfaces. That metal prevents some electrical contacts to the test pads of the next IC to be tested because the adhering metal holds the ceramic member slightly farther away from the test pads of the next IC and thus prevents proper electrical connection thereto. By their very nature, electrical connections of this type are very precarious because a spacing of even a few atomic layers may prevent a proper contact. In addition to the problem of adhering metal, there is the problem of uneven contact wear. If a semiconductor wafer is placed into the testing apparatus in such a way that one contact has more contacting force than the other, it will wear down at a faster rate. If another semiconductor wafer is then placed into the apparatus in a slightly different way, then the more worn contact may fail to make proper electrical contact or if a small amount of metal is removed from one contact surface during cleaning, then that contact will not electrically connect to its test pad.

U.S. Pat. No. 4,116,523 (C. W. Coberly et al) is directed to a high frequency probe which includes a composite dielectric layer having a conductive metal wire formed therein and running there through. The layer is sandwiched between a pair of relatively thin conductive flexure arms. A first end of the wire is connected to a center conductor of a coaxial cable and the arms are connected by first ends thereof to the shield of the cable. Separate electrical contact points are formed on second ends of the wire and the arms. These contact points make physical and electrical contact to an electrical device being probed. This probe is represented as having a uniform electrical impedance along its length.

This probe is relatively complex and may be relatively expensive to fabricate.

It is desirable to provide probing apparatus in which there is adequate independent motion of the contacting probe points while at the same time maintaining substantially constant resistive transmission line impedance down to the test pads of the integrated circuit and which is relatively non-complex and can be fabricated with reasonable economy.

SUMMARY OF THE INVENTION

Viewed from one aspect, the present invention is directed to probe apparatus comprising an essentially resistive impedance coaxial transmission line (cable) having a center conductor separated from an outer conductor (shield) by an insulator with a portion of the center conductor extending beyond the shield at a first end thereof and with a third conductor coupled by a first end to the outer conductor at or near the first end of the cable. The extension of the center conductor and the third conductor are spaced apart by air such that the impedance of the two conductors is essentially a resistive impedance. The cable is supported by a support member such that a portion of the cable, including portions located at or near the first end of the cable, and the extension of the center conductor and the third conductor extend beyond the support member. An end of the extension of the center conductor and a second end of the third conductor are adapted to make electrical contact to a device to be tested. A second end of the cable is connectable to sources of bias and/or test signals useful for testing a device being probed.

In a preferred embodiment the third conductor is a leaf spring member. During a probing operation the leaf spring member makes electrical contact to one test pad of a device (typically an integrated circuit) being probed and the end of the extension of the center conductor makes contact to another test pad. The leaf spring member is shaped so that as the probe assembly is brought into contact with the device, it contacts a test pad thereof first before the extension portion of the center conductor contacts another test pad thereof. Then as the probe assembly is brought into stronger contact, the leaf spring member flexes until the center conductor makes contact with the other test pad. As the probe assembly is brought into yet stronger contact, the body of the coaxial transmission line flexes to keep the spring-like member and center conductor in contact with their respective test pads while preventing excessive contacting forces that could damage the contacting surfaces of the probe assembly or the test pads of the integrated circuit.

The invention will be better understood from the following more detailed description taken in connection with the accompanying drawings.

DETAILED DESCRIPTION

Figure 1:
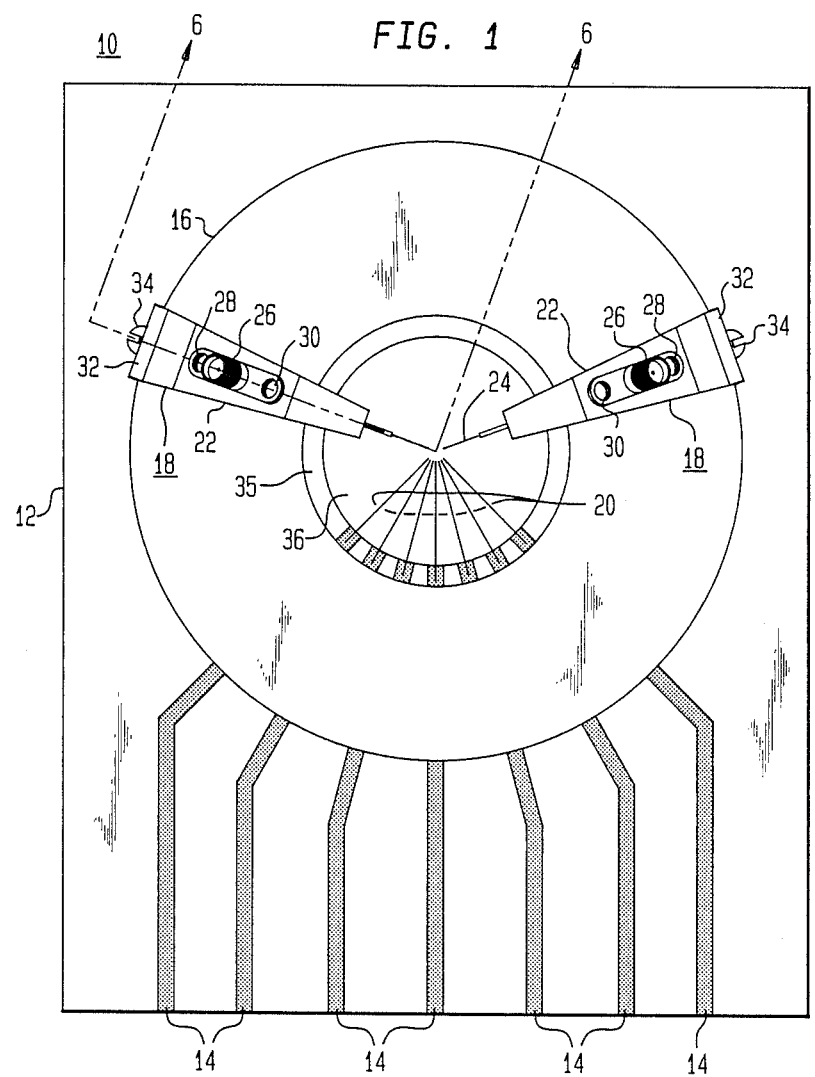
FIG. 1 is a top view of a printed circuit probe card assembly in accordance with the present invention.
Figure 2:
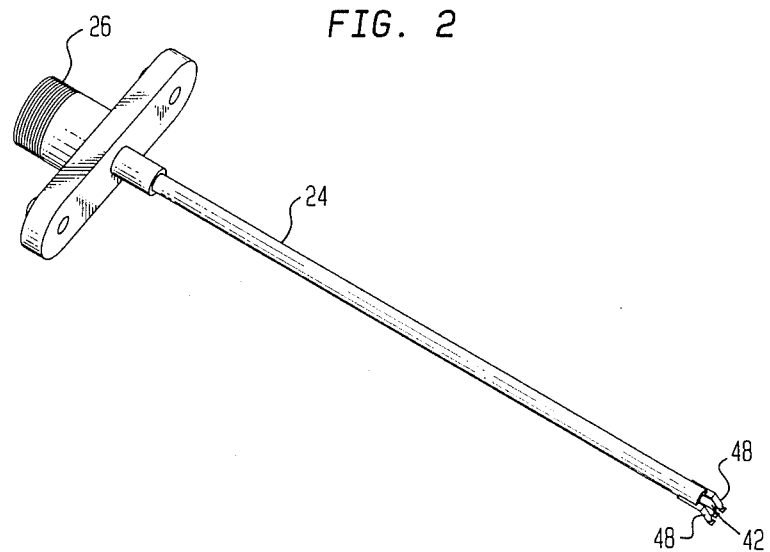
FIG. 2 shows an enlarged view of a coaxial transmission line (cable), probe ends and an electrical connector of one high speed probe assembly of FIG. 1.
Figure 3:
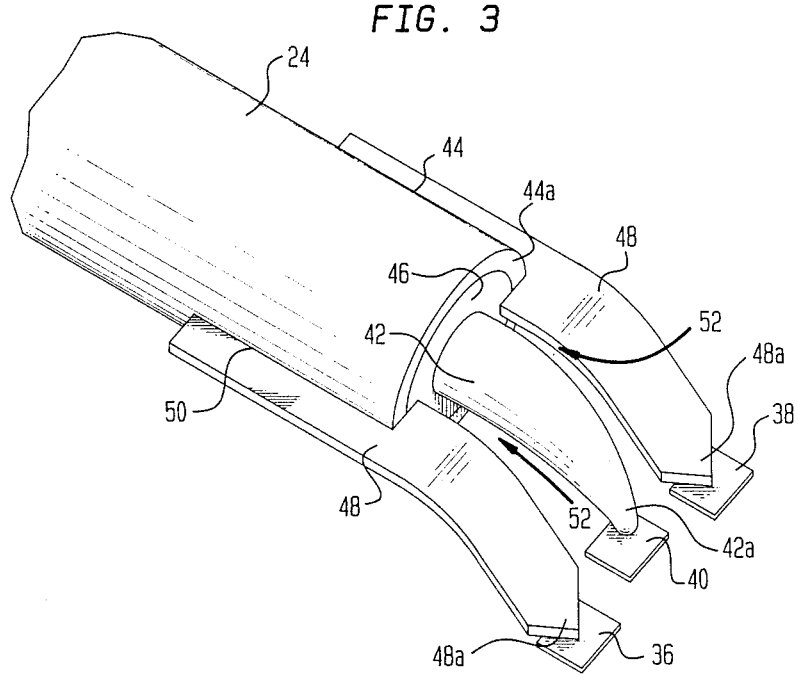
FIG. 3 shows an expanded perspective view of part of the cable and probe ends of FIG. 2.

Referring now to FIG. 1, there is illustrated a top view of a printed circuit probe card assembly 10 in accordance with the present invention which is particularly useful for probing integrated circuits (not shown) which operate at high speed. Assembly 10 comprises a printed circuit board 12 having printed conductors 14, a support ring 16, a plurality of high speed probe assemblies 18 (two of which are shown), and a plurality of needle-like probe members 20 (seven of which are shown). Probe assembly 18, which is shown enlarged and in greater detail in FIGS. 6 (a cross-sectional view taken through dashed line 6—6 of FIG. 1) and 7 (a top view), comprises a base support member 22, a coaxial transmission line (cable) 24, an electrical coupler 26, first and second fasteners 28 and 30 (shown as screws), a mechanical clamping member 32 (shown as a c-shaped clamp), a third fastener 34 (shown as a screw), a friction held plate 58 and a section of tubing 64. Cable 24 is shown enlarged and straightened out in FIG. 2 with same shown as being electrically coupled to electrical coupler 26. An enlarged view of a probing end of cable 24 is shown in FIG. 3.

Cables 24 are adapted to act as essentially fixed resistive transmission lines from one end to the other with very low series inductance. Accordingly, these cables 24 can be used to make electrical contact to test pads 36, 38 and 40 (conductive areas) (see FIGS. 3, 4 and 5) of an integrated circuit (not shown) which is to be tested. Electrical signals are coupled to cables 24 through couplers 26 to which are connected coaxial wires (not shown). As will become clearer from the below description, cables 24 facilitate repeated good electrical contact to pads of an integrated circuit under test while maintaining an essentially just resistive coupling from coupler 26 to the pads of the integrated circuit. This allows for high speed test signals to be applied to the integrated circuit under test without the electrical ringing that is associated with conventional probes such as the needle-like probes 20.

Printed circuit board 12 defines a hole 36 there through into which probes 20 and cables 24 extend and pass there through. Each of probes 20 is typically soldered to a first end of a separate one of the printed electrical lines 14. Support ring 16, which defines a central hole 35 there through, is mounted on, electrically isolated from, and is affixed to the printed circuit board 12 with the holes 35 and 36 being concentric. Second ends of printed electrical lines 14 are coupled to testing apparatus (not shown).

In one embodiment cables 24 are miniature coaxial lines each having a 50 ohm impedance and terminating at one end at one of electrical couplers 26. Couplers 26 can be standard connectors that can have standard size coaxial cables (not shown) connected thereto that are in turn connected to test apparatus (not shown). In this embodiment cables 24 are typically used to supply or sample test signals to or from, respectively, an integrated circuit under test. If it is desired to use one or more cables 24 to supply power to an integrated circuit under test, then those cables 24 advantageously are of relatively low impedance, typically 1 to 10 ohms.

Referring now to FIG. 3, there is shown an expanded view of a probing end of cable 24 which comprises a cylindrical center conductor 42, a cylindrical outer conductor 44 and an insulator member 46 which separates and electrically isolates the center 42 and outer 44 conductors. Center conductor 42 extends somewhat beyond an end 44a of outer conductor 44, has a probe end 42a which is conically shaped, and curves away from cable 24. Conductive leaf springs 48 (two are shown) are affixed into short slots 50 cut into the outer conductor 44 and each has a probe end 48a. The leaf springs 48 curve away from the center line of cable 24 more than the extension of center conductor 24. As will become clearer from the description to follow, the curve of leaf springs 48 relative to the curve of the extension of conductor 42 results in leaf springs 48 contacting test pads 36 and 38 before the extension of conductor 42 contacts test pad 40. The leaf springs 48 can be affixed by soldering, brazing, welding, electroplating or a variety of other means. Alternately, the leaf springs can be formed by extending a portion of the outer conductor 44. Advantageously in this case, the shield material would be made of an elastic metal such as Beryllium-Copper and would be of the proper thickness to provide the desired spring resiliency. The leaf springs 48 are disposed in such a way that their edges are physically separated from the center conductor by a small air gap 52. By choosing the proper dimension for the gap, the impedance of the center conductor 42 with respect to the leaf springs 48 can be made substantially equal to the impedance of the cable 24, thus reducing or eliminating electrical reflections. Center conductor 42 extends beyond the end 44a of outer conductor 44, typically by a distance of less than or equal to the outer diameter of the cable 24.

Figure 4:
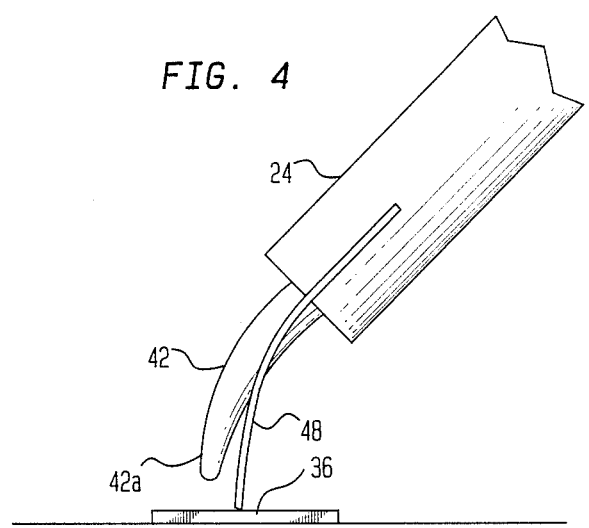
FIG. 4 shows a side view of contacting end tips of the high speed probe at the beginning of a probing (testing) operation of an integrated circuit.
Figure 5:
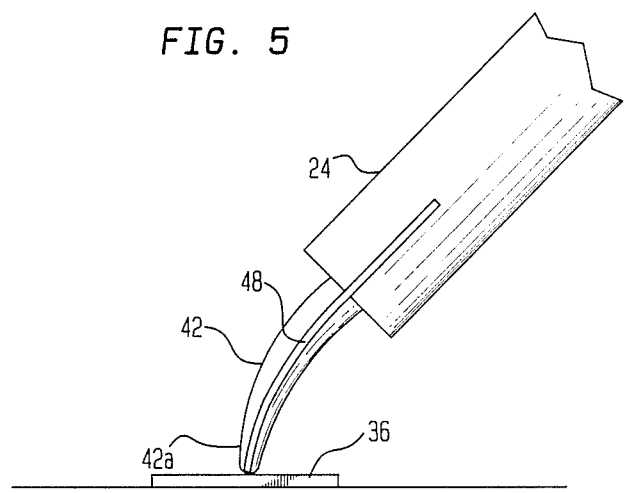
FIG. 5 shows a side view of the contacting end tips of the same high speed probe shown in FIG. 4 after all the end tips of the high speed probe have contacted the integrated circuit.

In operation, the assembly 10 is placed in contact with a circuit to be tested as follows: the assembly 10 is moved toward an integrated circuit or device (neither of which is shown) to be tested until the leaf spring ends 48a contact the test pads 36 and 38 of the integrated circuit to be tested (see FIG. 4). The assembly 10 is then moved farther in the same direction causing the flexure of the leaf springs 48 until the conical ends 42a of the conductors 42 contact the desired test pads 40 (see FIGS. 3 and 5). In a preferred embodiment the dimensions of the leaf springs 48 are chosen so that they flex approximately 0.0005 to 0.001 inch before the center conductor 42 makes contact to the desired test pad. Thereafter, the distance between the assembly 10 and the integrated circuit being tested is further decreased (over probed) until reliable contact has been made to all the test pads 36, 38 and 40 by probe ends 48a, 48a and 42a, respectively. During this last movement, the portion of the body of the coaxial cable 24 extending from the section of tubing 64 of probe assembly 18 (FIG. 6) flexes to prevent excessive forces being exerted between the contacting probe ends 42a and 48a and the test pads 36, 38 and 40. This averts damage to the probe ends 42a and 48a or to the test pads 36, 38 and 40. The last mentioned over probing is desirable because some of the probe ends 42a and 48a on the same probe card assembly 10 will in general make contact before others as a result of small, difficult to avoid, mechanical tolerances.

In a typical embodiment the cables 24 are miniature coaxial cables. For optimal operation, the mechanical stiffness of the miniature coaxial cable and the leaf springs must be properly related for reliable operation. In one embodiment, the leaf springs are approximately 0.015 inches long by 0.001 inches thick by 0.01 inches wide at the fixed end. The miniature coaxial cable is approximately 0.020 inches outside diameter and is cantilevered 0.40 inches from the free end.

The probe ends 42a and 48a can be coated with a special metal such as gold to improve the electrical contact to the test pads.

Figure 6:
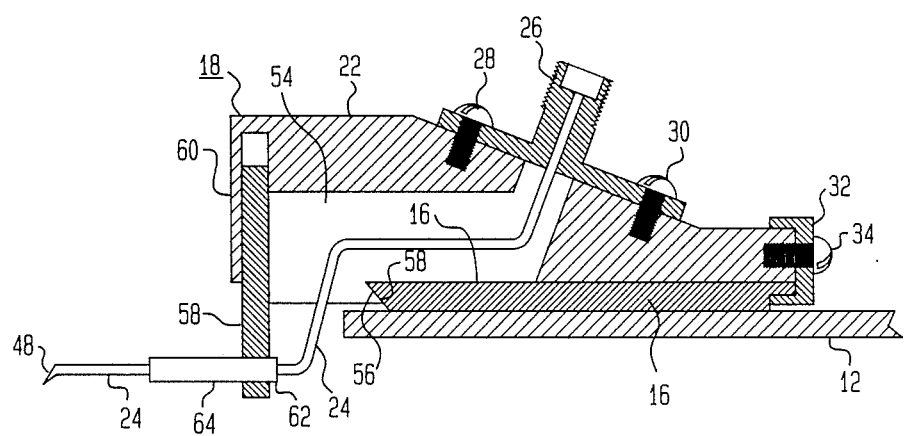
FIG. 6 shows a cross-sectional view of the high speed probe assembly of FIG. 1 through dashed line 6—6 of FIG. 1.
Figure 7:
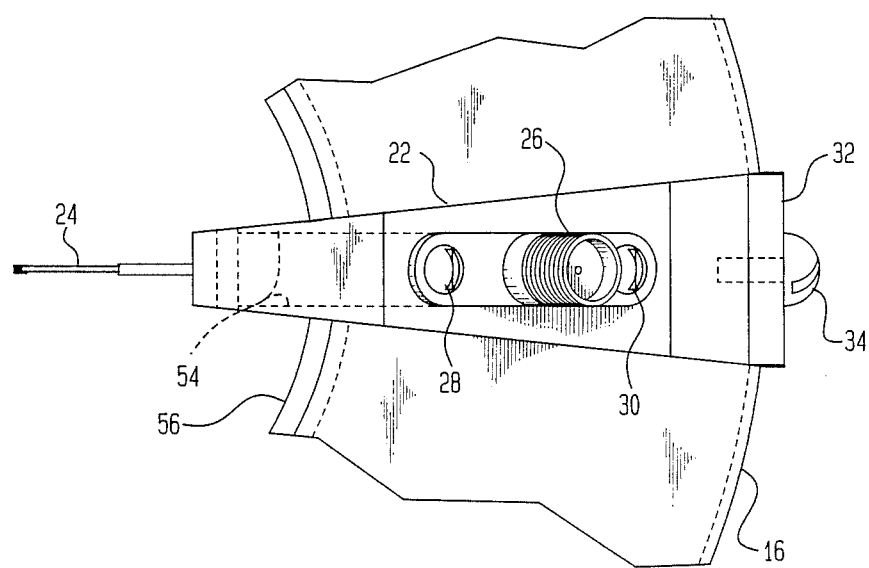
FIG. 7 shows an expanded top view of the high speed probe of FIG. 1.

An important feature of the printed circuit probe card assembly 10 is its mechanical strength and dimensional stability. The connector 26, which is typically a standard coaxial cable connector, is mounted onto the support member 16 in such a way that the probe ends 42a and 48a do not move while cables (not shown) are connected to connectors 26 and are tightened with a wrench. For this purpose, the connector 26 is advantageously mounted solidly onto support ring 16 of probe assembly 18, as shown in FIG. 6, with the miniature coaxial cable 24 extending through a slot 54 cut into the bottom of the base support member 22 and out beyond the front of the member 22. The member 22 could be mounted directly onto the probe card 12 or more advantageously, as is shown clearly in FIG. 6, is mounted onto support ring 16 (typically fabricated from metal) which is permanently fixed to the probe card 12. Using well known fastening methods, the member 22 is clamped solidly to the ring 16 at any position on the ring 16 and can then be removed and clamped at a different place on the ring 16 if desired. A convenient method of clamping member 22 to ring 16 is through the use of the clamp 32 and the screw 34 as is shown in FIG. 6. Member 22 has a V-shaped groove 56 cut into a bottom portion thereof which receives a correspondingly shaped edge 58 of the ring 16. C-shaped clamp 32 pulls against edge 58 of the ring 16 and also holds the base support member 22 firmly onto the outside of the ring 16.

A front end of the base support member 22 defines a spring clip 60, (see FIG. 6) which holds a friction mounted plate 58 that is employed to accurately position the probe ends 42a and 48a (see FIG. 3) with respect to the printed circuit board 12. Spring clip 60 frictionally holds the plate 58 in position against an end portion of support member 22. Plate 58 defines a hole 62 there through through which a short section of tubing 64 is placed. The miniature coaxial cable 24 is passed through tubing 64 such that conductor 42 and spring leaf members 48 and a portion of cable 24 extend past tubing 64 and are cantilevered.

One way to place the probe ends 42a and 48a where desired in either of two directions is to strike the plate 58 to move it. At this point the connector 26 is loosely mounted onto the base support member 22 so it can move forward and backward on the base support member 22. One way to place the probe ends 42a and 48a in a third direction is to strike connector 26 forward or backward so as to cause more or less of the end of conductor 24 to extend past tubing 64. After probe ends 42a and 48a have been placed exactly where desired, the connector screws 28 and 30 are tightened and an adhesive, typically in liquid form, is applied to the junction between the friction mounted plate 58 and the clip member 60 and to the end of the tube 64 that holds the miniature coaxial cable 24. The adhesive, when hardened, holds the miniature coaxial cable 24 firmly in the position previously set. By employing soluble adhesive, the adhesive can be dissolved in an appropriate solvent and then the probe can be repositioned if desired.

Figure 8:
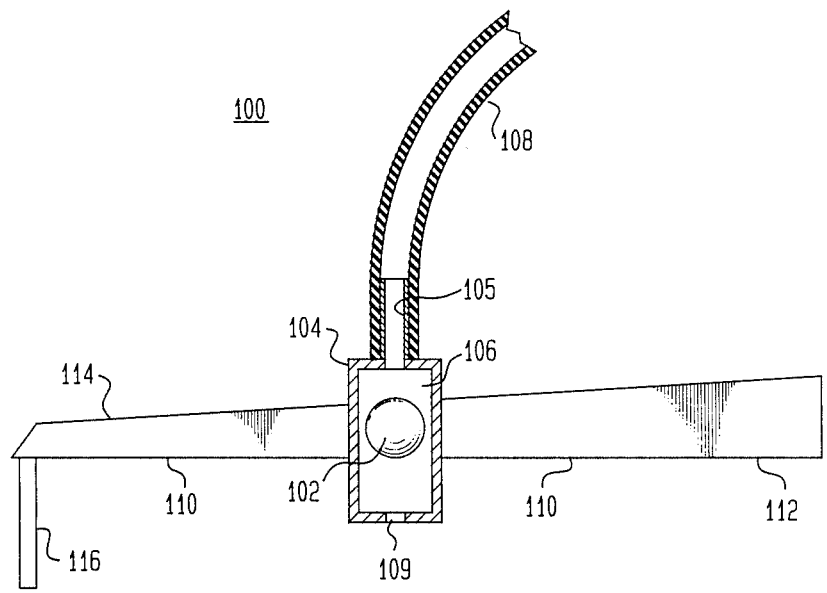
FIG. 8 shows a micropositioner useful to adjust the position of high speed probes of FIG. 1.

Referring now to FIG. 8, there is shown a cross-sectional view of a micropositioner 100 which can be used to strike a plate 116 so as to position. Micropositioner 100, which is the subject of a separate U. S. Patent Application (Ser. No. 180,477) that is being filed concurrently with the present patent application and in which the inventors and assignee are common, comprises a small metal ball 102 held captive inside a cylindrical chamber 106 which is defined by a housing 104. A force transmission member 110, typically fabricated from sheet metal and having a pointed end 114 and a handle end 112, is attached to housing 104. A tube (typically flexible) 108 is attached to a protrusion portion 105 of housing 104 and is in communication with chamber 106.

Ball 102 is made to move up and down inside the chamber 106 by air forced in and out of a flexible tube 108 which is coupled to chamber 106 through portion 105 of housing 104. Air forced downward through tube 108 drives the ball 102 downward inside the chamber 106 and the air escapes out of an orifice end 109 of housing 104. When the ball 102 strikes an end of the chamber 104 it imparts a sharp mechanical impulse to the housing 104 which is mounted solidly to the member 110. The chamber 106 transmits the mechanical impulse to the member 110. In operation, the sheet metal member 110 is hand-held by the handle end 112 and the pointed end 114 is placed in contact with the part 116 to be moved. Air forced through tube 108 causes the ball 102 to strike the inside of the chamber 106 of housing member 104 at the orifice end 109. The mechanical impulse generated is transmitted via member 110 to the pointed end 114 and thence to the part 116 to be moved. A vacuum is then applied to chamber 106 by pulling air out of tube 108 so as to move the ball 102 to the opposite end of chamber 106. Air is then again forced into tube 108 and thus into chamber 106 so as to force ball 102 to again strike the orifice end 109 of housing 104. By repeatedly striking the part 116, the part 116 can be moved a desired distance. By striking part 116 from different directions, part 116 can be moved in any direction desired.

The micropositioner 100 can be employed to move plate 58 of FIG. 6 and therefore to move probe ends 42a and 48a of FIG. 3 relative to test pads 40 and 36 and 38, respectively, of an integrated circuit under test. Micropositioner 100 is adapted to deliver a small but sharp mechanical impulse to move the friction held plate 58 and/or the connector 26 a very small distance of approximately 0.0001 to 0.0002 inches at each stroke.

It is to be understood that the specific design described as an exemplary embodiment is merely illustrative of the spirit and scope of the invention. Modifications can be made in the specific design consistent with the principles of the invention. Although this invention has been described in terms of its primary applicability to the construction of fixed point probe cards, it will have application to other electronic testing. In particular, one or more probes according to this invention can be mounted separately on one or more micropositioners and used to test the high-speed signal paths of integrated circuits, hybrid circuits or other circuits while in semiconductor wafer form or after packaging. In addition, other methods or construction beyond those outlined here could be used. Further, printed circuit probe card assembly 10 can be modified by eliminating ring 16 and base support member 22. Cables 24, with each having a conductor 42 extending past the end 44a of the cable 24 and leaf spring members 48, would be directly attached to a portion of card 12 near hole 36. A portion of each cable 24 and conductor 42 and spring leaf members 48 would be cantilevered and extend through hole 36. The other end of each cable 24 could be coupled to a connector 26 which is mounted on card 12 and could be connected directly to sources of bias and/or testing signals. Still further, the printed circuit probe card assembly 10 or the modification thereto denoted above need not have needle-like probes and printed circuit conductors.

What is claimed is:

1. Probe apparatus comprising:
a coaxial transmission line (cable) having a center conductor separated from a surrounding outer conductor by an insulating member and being characterized by an essentially resistive impedance;
the center conductor of the cable extends beyond the outer conductor at a first end of the cable;
a first end of a third conductor is coupled to a portion of the outer conductor located at or near the first end of the cable;
the extension portion of the center conductor and the third conductor being spaced apart by air such that the impedance of the two is essentially a resistance impedance;
an end of the extension portion of the center conductor and a second end of the third conductor being adapted to make electrical contact to a device;
a support member;
a portion of the cable near the first end thereof is supported by the support member such that that portion of the cable and the extension of the center conductor and the third conductor extend beyond the support member;
the third conductor being a spring-like member which is positioned relative to the extension portion of the center conductor such that during probing of a device the second end of the spring-like member first electrically contacts a portion of the device and then thereafter it flexes so as to allow an end of the extension portion of the center conductor to electrically contact another portion of the device;
the extension of the center conductor and the spring-like member being spaced apart by air during the time both make electrical contact to a device being probed by a distance which results in the impedance of the two being essentially a resistive impedance; and
the extension of the center conductor and the spring-like member being positioned such that when both make electrical contact with a device during probing they do so at an acute angle.

2. The probing apparatus of claim 1 wherein the spring-like member is a spring leaf member.

3. The probing apparatus of claim 1 further comprising positioning means for facilitating relatively accurate positioning of the end of the extension portion of the center conductor and the second end of the third conductor in first, second and third directions.

4. The probing apparatus of claim 3 wherein the support member further comprises an electrical coupler to which a second end of the cable is electrically coupled.

5. The probing apparatus of claim 1 wherein the resistive impedances of the coaxial transmission line and the extension of the center conductor and the spring-like member are approximately the same.

6. In combination:
an electrical probe device for testing electronic circuits, said probe device comprising:
a coaxial first transmission line having a center conductor separated from a surrounding outer conductor (shield) by an insulating member and being characterized by a substantially constant resistive impedance throughout the length thereof;
the center conductor of the transmission line extends beyond the shield at a first end of the transmission line;
an electrically conductive first spring-like member being electrically coupled by a first end to the shield at the first end of the transmission line and being air separated from the portion of the center conductor which extends beyond the outer conductor at the first end of the transmission line such that the impedance of the extension of the center conductor and the first spring-like member is essentially a resistive impedance during probing of a device when the first spring-like member and the extension of the center conductor both electrically contact the device;
a probe contact end of the extension portion of the center conductor and a second (probe contact) end of the first spring-like member having geometric shapes suitable for contacting areas of an electrical device to be probed by the electrical probe device;
the first spring-like member being positioned relative to the extension portion of the center conductor such that during a probing operation the probe contact end of the first spring-like member first electrically contacts a portion of a device being probed and then thereafter it flexes and forms an acute angle with respect to the device so as to allow the probe contact end of the extension portion of the center conductor to electrically contact another portion of the electrical device at an acute angle;
support and positioning means for supporting a central portion of the transmission line and for facilitating relatively accurate positioning of the probe contact end of the first spring-like member and the probe contact end of the extension of the center conductor in first, second and third directions;
an electrical coupler electrically coupled to the center conductor and to the shield at a second end of the first transmission line and being connectable through a second transmission line to a source of bias and/or testing signals; and
a portion of the first transmission line including portions thereof at and near the first end thereof, is supported by the support and positioning means such that a portion of the transmission line and the extension portion of the center conductor and the first spring-like member extend beyond the support and positioning means.

7. The combination of claim 6 comprising a second spring-like member coupled to the shield at the same end of the first transmission line as the first spring-like member such that the impedance between the second spring-like member and the extension of the center conductor is essentially a resistive impedance during probing of a device when the second spring-like member and the extension of the center conductor both electrically contact the device, the second spring-like member being essentially identical to the first spring-like member.

8. The combination of claim 7 further comprising a second essentially identical electrical probe device with both the probe devices being mechanically attached to a probe card assembly.

9. The combination of claim 8 further comprising a plurality of essentially identical electrical probe devices mechanically attached to the probe card assembly.

10. The combination of claim 8 in which the leaf springs are brazed or soldered into slots cut into the shield of the first transmission line.

11. The combination of claim 8 in which the spring-like members are leaf springs that are formed from an extension of the shield of the first transmission line.

12. The combination of claim 8 in which the probe contact end of the extension of the center conductor is conical and it and the probe contact ends of the leaf springs are coated with a highly conductive metal to enhance the electrical contact between all probe contact ends and a device being probed.

13. The combination of claim 9 in which the diameter and material of the transmission lines and the lengths of same which extend past the support and positioning means are selected to allow the transmission lines to flex sufficiently during a probing operation such that the ends of all of spring-like members and center conductors of the transmission lines make proper electrical contact to separate areas of a device being probed without causing any substantial damage to the probe contact ends or to the areas of the device being probed.

14. The combination of claim 9 in which the electrical couplers are standard electrical coaxial connectors.

15. The combination of claim 14 in which the support and positioning members are formed from blocks of metal or other strong hand materials which are appropriately hollowed out such that the first transmission lines pass there through and to which the standard electrical connectors are mechanically attached.

16. The combination of claim 15 wherein each of the electrical connectors is mounted on a separate one of the blocks of metal and each is positionable with respect to the block of metal it is mounted on such that the first transmission lines are positionable in one direction and then are maintainable in that position.

17. The combination of claim 16 further comprising a friction held member held by a portion of each metal block, each of the first transmission lines passes through an opening in the friction held member it is associated therewith, the friction held portion of the metal blocks are positionable in two directions such that the first transmission lines can be positioned in second and third directions.

18. The combination of claim 17 wherein an adhesive is applied to the support and positioning means and to the friction held member after the probe has been adjusted to a desired position so as to securely hold the friction held member relative to the metal block and to hold stable the position of the probe contact ends of the first transmission lines.

19. The combination of claim 17 wherein all of the probe devices are mounted on a ring member which is attached to the probe card assembly.

20. The combination of claim 19 wherein the probe card assembly comprises printed circuit wires with at least one needlelike conductor probe member being electrically coupled to one of the printed circuit wires.

21. A probe card assembly comprising:
a printed circuit board having printed conductors formed thereon and defining an opening there through;
needle-like conductive probes having first (probe contact) ends that extend through the opening in the printed circuit board and having second ends electrically and mechanically coupled to the printed conductors;
a high speed probe assembly comprising support and positioning means, a coaxial transmission line and an electrical connector;
the coaxial transmission line having a center conductor separated from a surrounding outer conductor (shield) by an insulating member and being characterized by a substantially constant resistive impedance throughout the length thereof;
the center conductor of the transmission line extends beyond the shield of the transmission line at a first end of the transmission line;
an electrically conductive spring-like member being electrically coupled by a first end to the shield at the first end of the transmission line and being separated from the portion of the center conductor which extends beyond the outer conductor at the first end of the transmission line such that the impedance of the extension of the center conductor and the spring-like member is essentially a resistive impedance during probing of a device when the spring-like member and the extension of the center conductor both electrically contact the device;
a probe contact end of the extension portion of the center conductor and a second (probe contact) end of the spring-like member having geometric shapes suitable for contacting areas of an electrical device to be probed by the probing apparatus;
the probe contact end of the center conductor and spring-like member extending through the opening in the printed circuit board;
the spring-like member being positioned relative to the extension portion of the center conductor such that during a probing operation the probe contact end of the spring-like member electrically contacts a device being probed and then thereafter it flexes and forms an acute angle with respect to the device so as to allow the probe contact end of the extension portion of the center conductor to electrically contact another portion of the device at an acute angle;
support and positioning means for supporting a central portion of the transmission line and for facilitating relatively accurate positioning of the probe contact end of the spring-like member and the probe contact end of the extension of the center conductor in first, second and third directions;
the support and positioning means being attached to the printed circuit board;

the electrical connector electrically coupled to the center conductor and to the shield at a second end of the first transmission line and being connectable through a second transmission line to a source of bias and/or testing signals; and a portion of the transmission line, including portions at or near the first end thereof, and the extension portion of the center conductor and the spring-like member all extend beyond the support and positioning means.

22. Probe apparatus comprising:

a coaxial cable having a center conductor separated from a surrounding outer conductor (shield) by an insulating member and being characterized by a substantially constant resistive impedance throughout the length thereof;

the cable having a first end where the center conductor extends by a useful amount past the shield;

at least one leaf-spring conductive member, said member being mechanically and electrically coupled to a portion of the outer conductor at the first end of the cable;

the leaf-spring member being air isolated from the portion of the center conductor which extends past the shield and being spaced apart from same by a preselected distance such that during probing of a device when the leaf-spring member and the portion of the center conductor which extends past the shield both electrically contact the device, the electrical impedance of the extension portion of the center conductor and the leaf-spring member is essentially constant and approximately equal to that of impedance of the cable;

the leaf-spring member being positioned with respect to the extension portion of the center conductor such that when the probe apparatus is positioned over an electrical device and is moved towards the device, the leaf-spring member first contacts the device and then flexes and forms an acute angle with respect to the device so as to allow a tip end of the extension portion of the center conductor to make contact with the device at an acute angle;

mechanical support means for supporting a central portion of the coaxial cable; and a portion of the coaxial cable, including the portions at and near the first end thereof and the extension portion of the center conductor and the leaf-spring member all extend beyond the mechanical support means.

23. Probe apparatus comprising:

a board member;

a coaxial first transmission line having a center conductor separated from a surrounding outer conductor (shield) by an insulating member and being characterized by a substantially constant resistive impedance throughout the length thereof;

the center conductor of the transmission line extends beyond the shield of the transmission line at a first end of the transmission line;

an electrically conductive spring-like member being electrically coupled by a first end to the shield at a first end of the transmission line and being separated from the portion of the center conductor which extends beyond the shield at the first end of the transmission line such that during probing of a device when the spring-like member and the portion of the center conductor which extends past the shield both electrically contact the device, the impedance of the extension of the center conductor and the spring-like member is essentially a resistive impedance;

the length of the spring-like member being approximately the same as the diameter of the coaxial transmission line;

a probe contact end of the extension portion of the center conductor and a second (probe contact) end of the spring-like member having geometric shapes suitable for contacting areas of an electrical device to be probed by the probing apparatus;

the spring-like member being positioned with respect to the extension portion of the center conductor such that during a probing operation the probe contact end of the spring-like member electrically contacts a portion of a device being probed and then thereafter it flexes and forms an acute angle with respect to the device so as to allow the probe contact end of the extension portion of the center conductor to electrically contact another portion of the electrical device at an acute angle;

support and positioning means for supporting a central portion of the transmission line and for facilitating relatively accurate positioning of the probe contact end of the spring-like member and the probe contact end of the extension of the center conductor in first, second and third directions;

the support and positioning means being attached to the board member;

an electrical coupler electrically coupled to the center conductor and to the shield at a second end of the first transmission line and being connectable through a second transmission line to a source of bias and/or testing signals; and a portion of the first transmission line, including portions at and near the first end thereof, and the extension portion of the center conductor and the spring-like member all extend beyond the support and positioning means and are cantilevered.

24. Probe apparatus comprising:

a board member;

a plurality of probe assemblies with each comprising a coaxial first transmission line (cable), support and positioning means and an electrical coupler;

each of the coaxial first transmission lines having a center conductor separated from a surrounding outer conductor (shield) by an insulating member and being characterized by a substantially constant resistive impedance throughout the length thereof;

the center conductor of each of the transmission lines extends beyond the shield of the transmission line at a first end of each of the transmission lines;

an electrically conductive leaf spring member being electrically coupled by a first end to each of the shields at a first end of each of the transmission lines and being separated from the portion of the center conductor which extends beyond the outer conductor at the first end of each of the transmission lines such that during probing of a device when the leaf spring member and the portion of the center conductor which extends past the shield both electrically contact the device, the impedance of the extension of the center conductor and the leaf spring member is essentially a resistive impedance;

the length of each of the leaf spring members being approximately the same as or less than the diameter of the coaxial transmission line it is associated with;

a probe contact end of the extension portion of each of the center conductors and a second (probe contact) end of each of the leaf spring members having geometric shapes suitable for contacting areas of an electrical device to be probed by the probing apparatus;

the leaf spring members being positioned with respect to the extension portion of each of the center conductors such that during a probing operation the probe contact ends of the leaf spring members electrically contact a portion of a device being probed and then thereafter they flex and form acute angles with respect to the device so as to allow the probe contact ends of the extension portion of the center conductors to electrically contact other portions of the electrical device at acute angle;

a plurality of support and positioning means with each for supporting a central portion of one of the transmission lines and for facilitating relatively accurate positioning of the probe contact ends of the leaf spring members and the probe contact ends of the extension of the center conductors in first, second and third directions;

the support and positioning means being attached to the board member;

a plurality of electrical couplers with a separate one being electrically coupled to the center conductor and to the shield at a second end of each of the first transmission lines and being connectable through one of a second plurality of transmission lines to a source of bias and/or testing signals; and a portion of each of the first transmission lines, including the portions at and near the first end thereof, and the extension portion of the center conductor and the leaf spring member all extend beyond the support and positioning means and are cantilevered such that during a probing operation the probe contact ends of the leaf spring members of one or more of probe assemblies electrically contact a portion of a device being probed and then thereafter they flex so as to allow the probe contact ends of the extension portion of the center conductors associated therewith to electrically contact other portions of the electrical device and then a portion of one or more of the cables having the contacting probe ends flex so as to allow the leaf spring members and center conductors of all of the probe assemblies to electrically contact the device without causing substantially damage to the probe ends or the device.

25. Probe apparatus comprising:

a printed circuit board with a plurality of electrical conductors formed thereon;

a plurality of needle-like probes with a separate one of same being coupled to a separate one of the electrical conductors, said needle-like probes being adapted to electrically contact portions of a device to be probed;

a plurality of probe assemblies with each comprising a coaxial first transmission line (cable), support and positioning means and an electrical coupler;

each of the coaxial first transmission lines having a center conductor separated from a surrounding outer conductor (shield) by an insulating member and being characterized by a substantially constant resistive impedance throughout the length thereof;

the center conductor of each of the transmission lines extends beyond the shield of the transmission line at a first end of each of the transmission lines;

an electrically conductive leaf spring member being electrically coupled by a first end to the each of the shields at a first end of each of the transmission lines and being separated from the portion of the center conductor which extends beyond the outer conductor at the first end of each of the transmission lines such that during probing of a device when the leaf spring member and the portion of the center conductor which extends past the shield both electrically contact the device, the impedance of the extension of the center conductor and the leaf spring member is essentially a resistive impedance;

the length of each of the leaf spring members being approximately the same as or less than the diameter of the coaxial transmission line it is associated with;

a probe contact end of the extension portion of each of the center conductors and a second (probe contact) end of each of the leaf spring members having geometric shapes suitable for contacting areas of an electrical device to be probed by the probing apparatus;

the leaf spring members being positioned with respect to the extension portion of each of the center conductors such that during a probing operation the probe contact ends of the leaf spring members electrically contact a portion of a device being probed and then thereafter they flex and form acute angles with respect to the device so as to allow the probe contact ends of the extension portion of the center conductors to electrically contact other portions of the electrical device at acute angles;

a plurality of support and positioning means with each for supporting a central portion of one of the transmission lines and for facilitating relatively accurate positioning of the probe contact ends of the leaf spring members and the probe contact ends of the extension of the center conductors in first, second and third directions;

the support and positioning means being attached to the printed circuit board;

a plurality of electrical couplers with a separate one being electrically coupled to the center conductor and to the shield at a second end of each of the first transmission lines and being connectable through one of a second plurality of transmission lines to a source of bias and/or testing signals; and a portion of each of the first transmission lines, including portions at and near the first end thereof, and the extension portion of the center conductor and the leaf spring member all extend beyond the support and positioning means and are cantilevered such that during the probing of a device the probe contact ends of the leaf spring members of one or more of probe assemblies electrically contact a portion of a device being probed and then thereafter they flex so as to allow the probe contact ends of the extension portion of the center conductors associated therewith to electrically contact other portions of the electrical device and then a portion of one or more of the cables having the contacting probe ends flex so as to allow the leaf spring members and center conductors of all of the probe assemblies to electrically contact the device without causing substantial damage to the probe ends and to the device.

26. Probe apparatus comprising:

a support member;

a plurality of a coaxial transmission lines (cables) with each having a center conductor separated from a surrounding outer conductor by an insulating member and being characterized by an essentially resistive impedance;

the center conductor of each cable extends beyond the outer conductor at a first end of each cable;

a plurality of leaf spring conductors with a first end of each leaf spring conductor being electrically coupled to the outer conductor at the first end of each cable;

second (probe contact) ends of the extension portion of each center conductor and the leaf spring conductor being adapted to make electrical contact to a device;

the extension portion of a center conductor and a leaf spring conductor of one cable being spaced apart from one another by air such that during probing of a device when the leaf spring conductor and the portion of the center conductor which extends past the outer conductor both electrically contact the device, the impedance of the two is essentially a resistive impedance while both contact a device being probed;

a central portion of each cable being supported by the support member so that a portion of each cable and the extension of the center conductor and the leaf spring conductor are cantilevered from a point at which they are supported such that during a probing operation one or more of the leaf spring conductors first electrically contact a device being probed and then thereafter it (they) flexes (flex) so as to allow one or more of the extension portions of the center conductors to electrically contact the device at an acute angle and then thereafter one or more of the cantilevered portions of the cable flex so as to allow all other extension portions of the center conductor and the leaf spring conductors to electrically contact the device at acute angles without causing substantial damage to the probe assembly or to the device being probed.

27. Probe apparatus comprising:

a coaxial transmission line (cable) having a center conductor separated from a surrounding outer conductor by an insulating member and being characterized by an essentially resistive impedance;

the center conductor of the cable extends beyond the outer conductor at a first end of the cable;

a first end of a third conductor is coupled to a portion of the outer conductor located at or near the first end of the cable;

the extension portion of the center conductor and the third conductor being spaced apart by air such that the impedance of the two is essentially a resistance impedance;

an end of the extension portion of the center conductor and a second end of the third conductor being adapted to make electrical contact to a device;

a support member;

a portion of the cable near the first end thereof is supported by the support member such that that portion of the cable and the extension of the center conductor and the third conductor extend beyond the support member;

the third conductor being a spring-like member which is positioned relative to the extension portion of the center conductor such that during probing of a device the second end of the spring-like member first electrically contacts a portion of the device and then thereafter it flexes so as to allow an end of the extension portion of the center conductor to electrically contact another portion of the device;

the extension of the center conductor and the spring-like member being spaced apart by air during the time both make electrical contact to a device being probed by a distance which results in the impedance of the two being essentially a resistive impedance; and the extension of the center conductor and the spring-like member being positioned such that when both make electrical contact with a device during probing they do so at an acute angle.

* * * * *